US011171106B2

(12) United States Patent
Lin et al.

(10) Patent No.: US 11,171,106 B2
(45) Date of Patent: Nov. 9, 2021

(54) SEMICONDUCTOR PACKAGE STRUCTURE WITH CIRCUIT SUBSTRATE AND MANUFACTURING METHOD THEREOF

(71) Applicant: Powertech Technology Inc., Hsinchu County (TW)

(72) Inventors: Nan-Chun Lin, Hsinchu County (TW); Hung-Hsin Hsu, Hsinchu County (TW); Shang-Yu Chang Chien, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 4 days.

(21) Appl. No.: 16/740,496

(22) Filed: Jan. 13, 2020

(65) Prior Publication Data
US 2021/0074661 A1 Mar. 11, 2021

(30) Foreign Application Priority Data
Sep. 6, 2019 (TW) .................................. 108132224

(51) Int. Cl.
*H01L 23/00* (2006.01)
*H01L 21/48* (2006.01)
(Continued)

(52) U.S. Cl.
CPC .......... *H01L 24/14* (2013.01); *H01L 21/4853* (2013.01); *H01L 21/56* (2013.01); *H01L 23/3121* (2013.01); *H01L 23/49861* (2013.01)

(58) Field of Classification Search
CPC ..... H01L 24/14; H01L 21/4853; H01L 21/56; H01L 23/3121; H01L 23/49861
See application file for complete search history.

(56) References Cited

U.S. PATENT DOCUMENTS 10,192,816 B2 1/2019 Kelly et al.
10,707,168 B2 * 7/2020 Alur .................... H01L 21/4857
(Continued)

FOREIGN PATENT DOCUMENTS

| TW | 201830598 | 8/2018 |
| TW | 201911518 | 3/2019 |
| TW | 201926586 | 7/2019 |

OTHER PUBLICATIONS

"Office Action of Taiwan Counterpart Application", dated Jun. 2, 2020, pp. 1-7.

*Primary Examiner* — Quoc D Hoang
(74) *Attorney, Agent, or Firm* — JCIPRNET (57) ABSTRACT

A semiconductor package structure including a circuit substrate, at least one chip, an encapsulant, a plurality of conductive connectors, a redistribution layer, and a plurality of conductive terminals is provided. The circuit substrate has a first surface and a second surface opposite to the first surface. The at least one chip has an active surface and a rear surface opposite to the active surface. The at least one chip is disposed on the circuit substrate with the rear surface. The encapsulant encapsulates the at least one chip. The plurality of conductive connectors surrounds the at least one chip. The redistribution layer is located on the encapsulant. The plurality of conductive terminals is located on the second surface. The at least one chip is electrically connected to the plurality of conductive terminals via the redistribution layer, the plurality of conductive connectors, and the circuit substrate. A manufacturing method of a semiconductor package structure is also provided.

18 Claims, 11 Drawing Sheets

(51) Int. Cl.
  *H01L 21/56* (2006.01)
  *H01L 23/31* (2006.01)
  *H01L 23/498* (2006.01)

(56) References Cited

U.S. PATENT DOCUMENTS

2017/0077035 A1\* 3/2017 Tao .................. H01L 24/82
2018/0366436 A1  12/2018 Wang et al.
2020/0235065 A1\* 7/2020 Chang ................ H01L 25/0655

\* cited by examiner

SEMICONDUCTOR PACKAGE STRUCTURE WITH CIRCUIT SUBSTRATE AND MANUFACTURING METHOD THEREOF

CROSS-REFERENCE TO RELATED APPLICATION

This application claims the priority benefit of Taiwan application serial no. 108132224, filed on Sep. 6, 2019. The entirety of the above-mentioned patent application is hereby incorporated by reference herein and made a part of this specification.

BACKGROUND OF THE INVENTION

1. Field of the Invention

The invention relates to a package structure and a manufacturing method thereof, and in particular, to a semiconductor package structure and a manufacturing method thereof.

2. Description of Related Art

In order to make electronic products light, thin, short and small, the semiconductor package technology has been constantly improved so as to develop products with smaller volume, lighter weight, higher integration level and higher market competitiveness. Therefore, it has become a challenge for researchers in the art to reduce the manufacturing cost of a semiconductor package structure while maintaining its high input/output (I/O) connection numbers.

SUMMARY OF THE INVENTION

The invention provides a semiconductor package structure and a manufacturing method thereof, which can enable the semiconductor package structure to have high I/O connection numbers, improve the electrical performance and/or efficacy and reduce the manufacturing cost.

The invention provides a semiconductor package structure including a circuit substrate, at least one chip, an encapsulant, a plurality of conductive connectors, a redistribution layer and a plurality of conductive terminals. The circuit substrate has a first surface and a second surface opposite to the first surface. The at least one chip has an active surface and a rear surface opposite to the active surface. The at least one chip is disposed on the circuit substrate with the rear surface. The encapsulant encapsulates at least one chip. The plurality of conductive connectors surround the at least one chip. The redistribution layer is located on the encapsulant. The plurality of conductive terminals are located on the second surface. The at least one chip is electrically connected to the plurality of conductive terminals via the redistribution layer, the plurality of conductive connectors and the circuit substrate.

The invention provides a manufacturing method of the semiconductor package structure, which includes the following steps. A circuit substrate is provided. The circuit substrate has a first surface and a second surface opposite to the first surface. At least one chip is disposed on the first surface. The at least one chip has an active surface and a rear surface opposite to the active surface. The at least one chip is disposed on the circuit substrate with the rear surface. An encapsulant is formed to encapsulate the at least one chip. A plurality of conductive connectors are formed to surround the at least one chip. A redistribution layer is formed on the encapsulant. The plurality of conductive terminals are formed on the second surface. The at least one chip is electrically connected to the plurality of conductive terminals via the redistribution layer, the plurality of conductive connectors and the circuit substrate.

Based on the foregoing, in the semiconductor package structure, since the circuit substrate is not a temporary carrier substrate, the cost for using the temporary carrier substrate can be saved during a manufacturing process of the semiconductor package structure, and an additional manufacturing procedure of removing the temporary carrier substrate is avoided, thereby further reducing the manufacturing cost of the semiconductor package structure. Furthermore, since the at least one chip is electrically connected to the plurality of conductive terminals via the redistribution layer, the plurality of conductive connectors and the circuit substrate, the semiconductor package structure has high I/O connection numbers by virtue of the redistribution layer, the plurality of conductive connectors and the circuit substrate. Moreover, a signal of the at least one chip is reconfigured and extended out, so that the electrical performance and/or efficacy of the semiconductor package structure can be improved.

DESCRIPTION OF THE EMBODIMENTS

As used herein, the directional terms (such as above, below, left, right, front, back, top, and bottom) are merely used for ease of understanding the drawings and are not intended to indicate absolute directions.

Unless otherwise particularly stated, any method described herein is not intended to be construed as implementing steps in a particular order.

The present invention will be fully explained with reference to the drawings of the embodiments. However, the present invention may also be embodied in various different forms and should not be limited to the embodiments described in the specification. Thicknesses and sizes of layers or regions may be enlarged for clarity. Same or like reference numerals are used to indicate same or like elements. Details may be omitted in the description of the following sections.

FIG. 1A to FIG. 1D are partial schematic cross-sectional views illustrating partial manufacturing methods of a semiconductor package structure according to an embodiment of the invention.

Figure 1A:
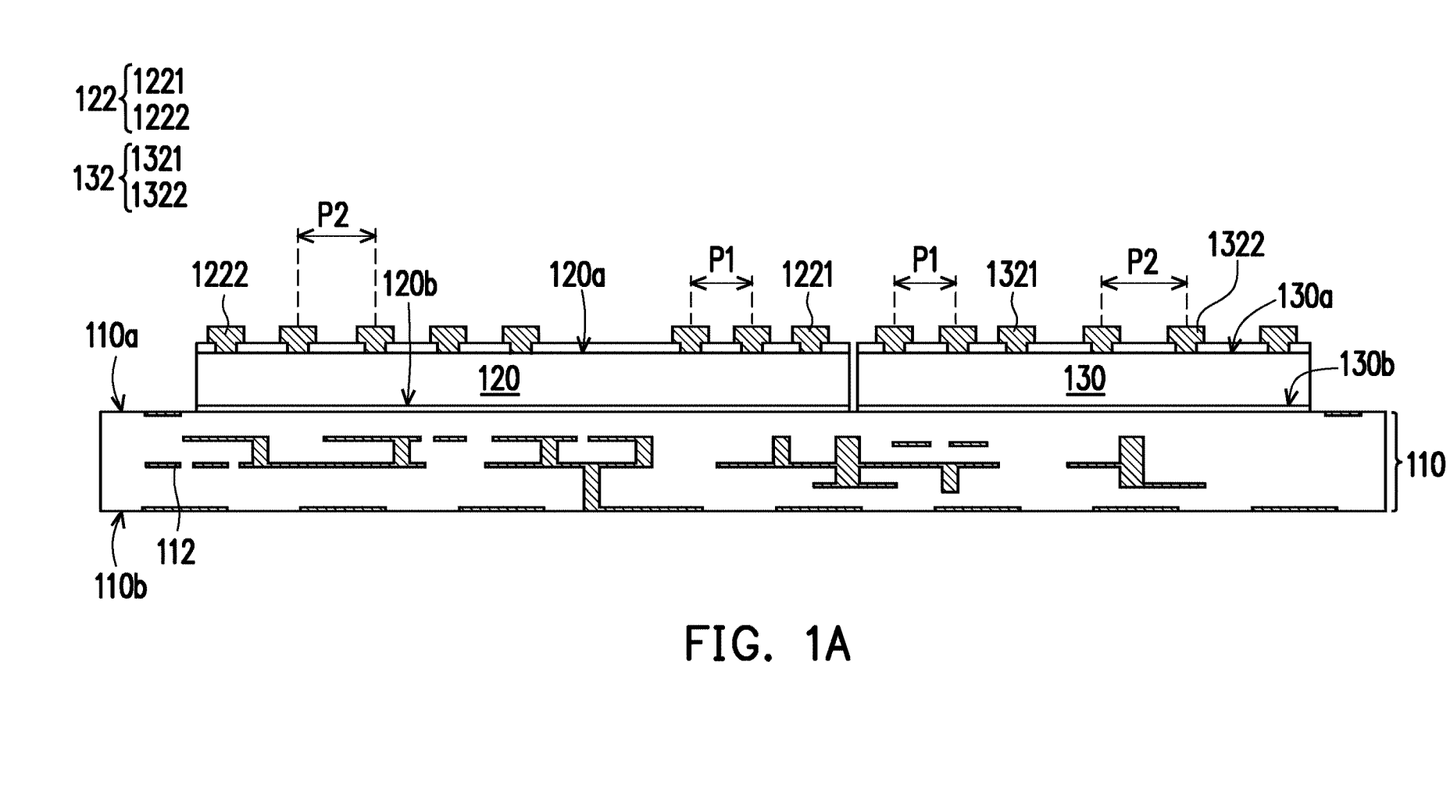
FIG. 1A to FIG. 1D are partial schematic cross-sectional views illustrating partial manufacturing methods of a semiconductor package structure according to an embodiment of the invention.

Referring to FIG. 1A, in the present embodiment, a manufacturing process of a semiconductor package structure 100 may include the following steps. First, a circuit substrate 110 is provided. The circuit substrate 110 has a first surface 110a and a second surface 110b opposite to the first surface 110a. The circuit substrate 110 may have a conductive circuit 112 for the subsequent electrical connection. The conductive circuit 112 may consist of a plurality of circuit layers and through holes or blind holes connecting the plurality of circuit layers, but the invention is not limited thereto.

In some embodiments, the circuit substrate 110 may be a printed circuit board (PCB), an organic substrate or a high-density interconnection substrate. Nevertheless, the invention does not restrict a type of the circuit substrate 110. Circuit substrates 110 having the suitable conductive circuit 112 capable of providing the electrical connection required in the subsequent manufacturing process shall fall within the protection scope of the invention.

It should be noted that the circuit substrate 110 is a permanent substrate, in other words, the circuit substrate 110 is not a temporary carrier substrate, so that the cost for using a temporary carrier substrate can be saved during the manufacturing process of the semiconductor package structure 100, and an additional manufacturing procedure of removing the temporary carrier substrate is avoided, thereby further reducing the manufacturing cost of the semiconductor package structure 100.

Continuing to refer to FIG. 1A, at least one chip is disposed on the first surface 110a of the circuit substrate 110. Two chips (a first chip 120 and a second chip 130) are schematically shown in FIG. 1A to FIG. 1D, but the invention is not limited thereto. In the present embodiment, the first chip 120 and the second chip 130 may have different functions. For example, the first chip 120 may be a system on chip (SoC), while the second chip 130 may be a dynamic random access memory (DRAM), but the invention is not limited thereto. In other embodiments, the first chip 120 and the second chip 130 may be other suitable semiconductor chips.

A size of the first chip 120 may be different from that of the second chip 130. For example, the size of the first chip 120 may be greater than the size of the second chip 130. A orthographic projection area of the first chip 120 on the first surface 110a may be greater than a orthographic projection area of the second chip 130 on the first surface 110a, but the invention is not limited thereto.

The at least one chip has an active surface and a rear surface opposite to the active surface. For example, in the present embodiment, the first chip 120 has the active surface 120a and the rear surface 120b opposite to the active surface 120a, while the second chip 130 has the active surface 130a and the rear surface 130b opposite to the active surface 130a. As shown in FIG. 1A, the first chip 120 and the second chip 130 are disposed on the circuit substrate 110 in a face-up manner. In other words, the first chip 120 is disposed on the circuit substrate 110 with the rear surface 120b. The second chip 130 is disposed on the circuit substrate 110 with the rear surface 130b.

The at least one chip may be attached to the circuit substrate 110 via an adhesive layer, so that the adhesive layer is sandwiched between the at least one chip and the circuit substrate 110. For example, in the present embodiment, the adhesive layer may be disposed at the rear surface 120b of the first chip 120 and the rear surface 130b of the second chip 130. The adhesive layer can improve an adhesion between the chip and the circuit substrate 110 so as to prevent the displacement of the chip. The adhesive layer may include a die attach film (DAF) formed by resin. However, the invention is not limited thereto. In some alternative embodiments, other materials having adhesion characteristics may be used as a material of the adhesive layer.

Continuing to refer to FIG. 1A, the active surface of each of the at least one chip may have a plurality of conductive bumps. For example, in the present embodiment, the active surface 120a of the first chip 120 may have a plurality of conductive bumps 122. The active surface 130a of the second chip 130 may have a plurality of conductive bumps 132.

The plurality of conductive bumps may include a plurality of first conductive bumps and a plurality of second conductive bumps. A pitch P1 between the plurality of first conductive bumps is less than a pitch P2 between the plurality of second conductive bumps. For example, as shown in FIG. 1A, in the present embodiment, the plurality of conductive bumps 122 may include a plurality of first conductive bumps 1221 and a plurality of second conductive bumps 1222. The plurality of conductive bumps 132 may include a plurality of first conductive bumps 1321 and a plurality of second conductive bumps 1322. The pitch P1 between the plurality of first conductive bumps 1221 is less than the pitch P2 between the plurality of second conductive bumps 1222. The pitch P1 between the plurality of first conductive bumps 1321 is less than the pitch P2 between the plurality of second conductive bumps 1322. The pitch P1 herein is a distance between centre points of two adjacent first conductive bumps (two adjacent first conductive bumps 1221 or two adjacent first conductive bumps 1321). The pitch P2 is a distance between centre points of two adjacent second conductive bumps (two adjacent second conductive bumps 1222 or two adjacent second conductive bumps 1322).

Since the pitch P1 between the plurality of first conductive bumps is less than the pitch P2 between the plurality of second conductive bumps, the plurality of first conductive bumps having a fine pitch may be used as a signal input/output contact, while the plurality of second conductive bumps having a coarse pitch may be used as a power supply/grounding contact, but the invention is not limited thereto.

Figure 1B:
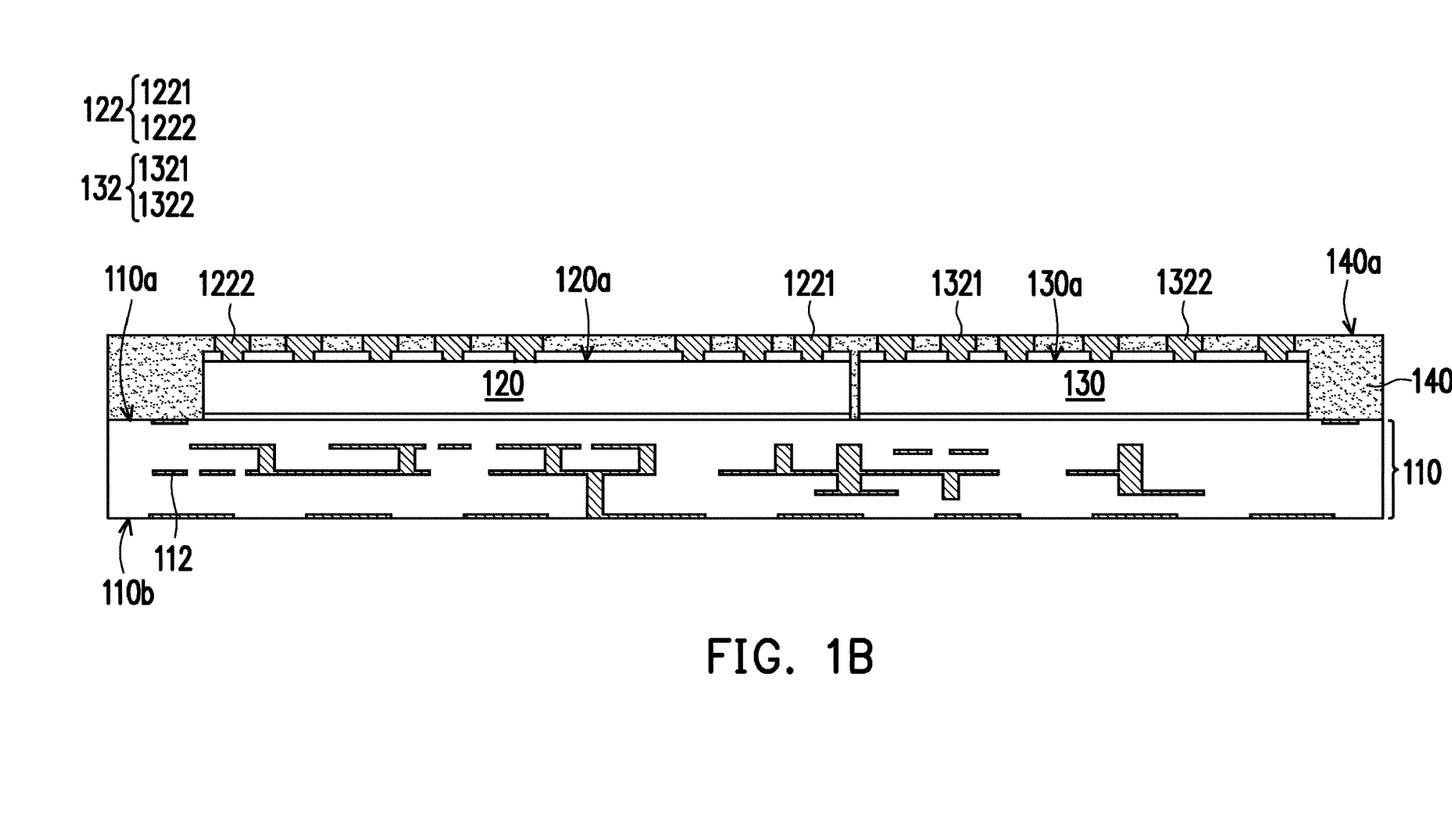

Referring to FIG. 1B, an encapsulant 140 is formed on the first surface 110a of the circuit substrate 110 to encapsulate the at least one chip. For example, in the present embodiment, the encapsulant 140 may encapsulate the first chip 120 and the second chip 130. In one embodiment, the encapsulant 140 may be a molding compound formed by a molding process. In one embodiment, the encapsulant 140, for example, may be formed by insulating materials such as epoxy resin or other suitable resins, but the invention is not limited thereto.

In the present embodiment, steps of forming the encapsulant 140 may be as follows: First, an encapsulating material is formed on the first surface 110a of the circuit substrate 110 so as to completely cover the first chip 120 and the second chip 130. Subsequently, a planarization process is performed for the encapsulating material until the conductive bumps 122 on the active surface 120a of the first chip 120 and the conductive bumps 132 on the active surface 130a of the second chip 130 are exposed, so that top surfaces of the conductive bumps 122, top surfaces of the conductive bumps 132 and a top surface 140a of the encapsulant 140 are substantially coplanar. The planarization process may include a chemical-mechanical polishing (CMP) process, a mechanical grinding process, an etching process or other suitable processes.

Figure 1C:
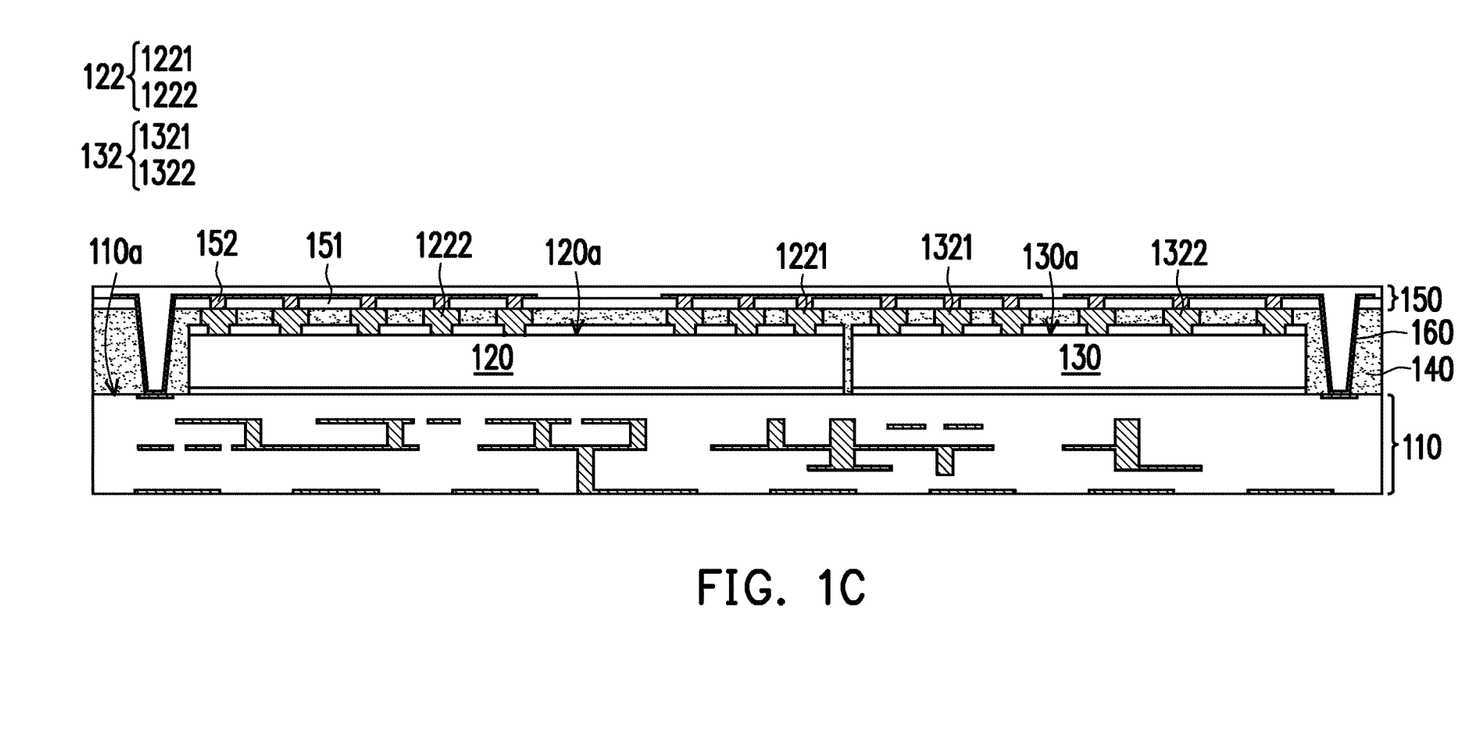

Referring to FIG. 1C, a redistribution layer 150 is formed on the encapsulant 140. In the present embodiment, the redistribution layer 150 may include a plurality of dielectric layers and a plurality of patterned conductive layers partially embedded in the dielectric layers. The dielectric layers may include bottom dielectric layers 151 close to the encapsulant 140, while the patterned conductive layers may include a plurality of conductive patterns 152 close to the encapsulant 140.

Figure 1D:
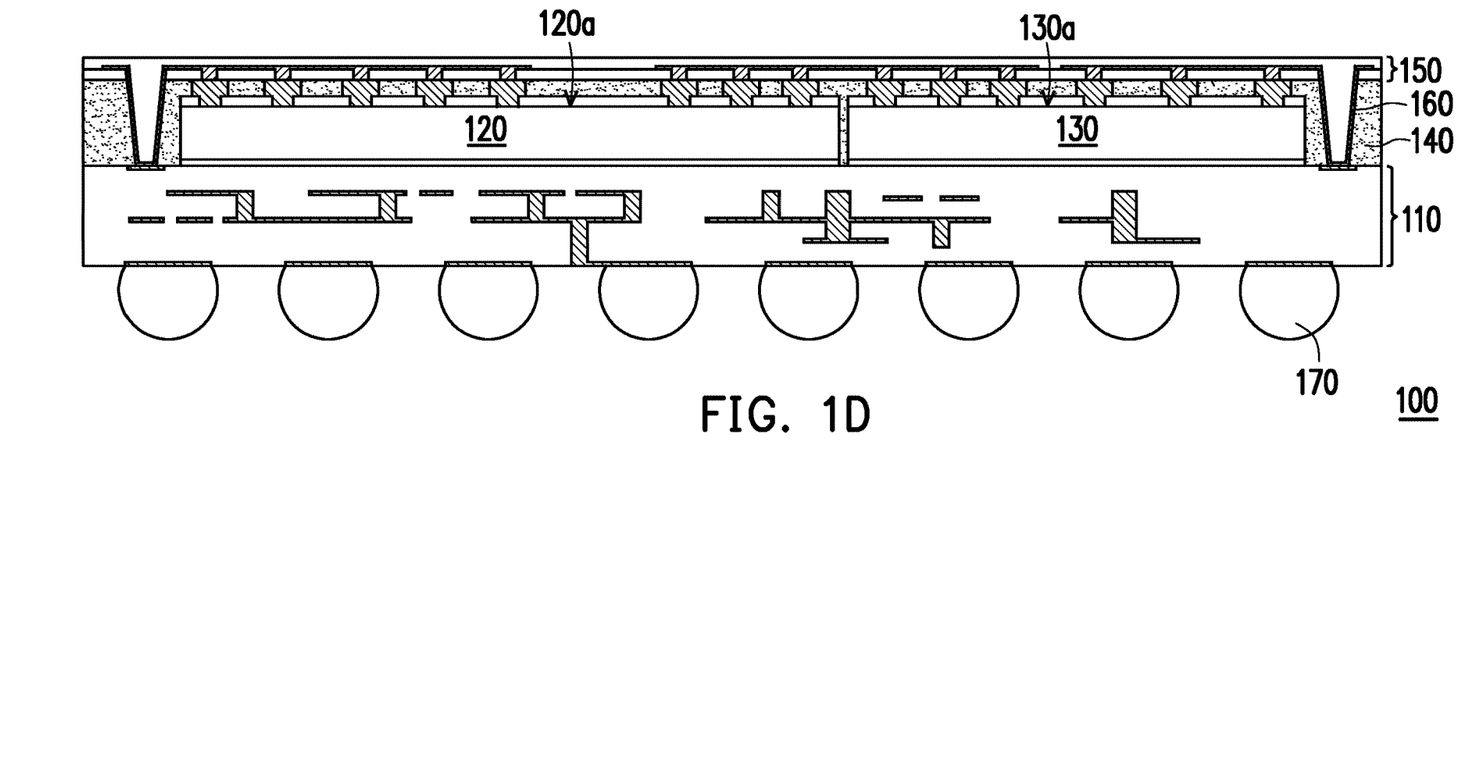

In the present embodiment, steps of forming the redistribution layer 150 may be as follows: First, a dielectric material is formed on the encapsulant 140. Subsequently, a plurality of first openings and a plurality of second openings are formed in the dielectric material. The plurality of first openings exposes the plurality of conductive bumps on the active surface of each of the at least one chip (the first chip 120 and the second chip 130), and the plurality of second openings expose partial first surface 110a of the circuit substrate 110. Thereafter, conductive materials are formed in the plurality of first openings and the plurality of second openings. The conductive materials at least cover side walls and bottom surfaces of the plurality of second openings. The conductive materials at least covering the side walls and bottom surfaces of the plurality of second openings are configured to form a plurality of conductive connectors 160 (two conductive connectors are schematically shown in FIG. 1C and FIG. 1D).

The plurality of conductive connectors 160 surround the at least one chip. For example, in the present embodiment, the plurality of conductive connectors 160 surround the first chip 120 and the second chip 130. The plurality of conductive connectors 160 may penetrate through the encapsulant 140. The plurality of conductive connectors 160 may extend from the redistribution layer 150 to the circuit substrate 110. The encapsulant 140 may fill between the plurality of conductive connectors 160. The plurality of conductive connectors 160 may be a through molding via (TMV).

The at least one chip is electrically connected to the redistribution layer 150 via the plurality of conductive bumps. For example, in the present embodiment, the first chip 120 may be electrically connected to the redistribution layer 150 via the conductive bumps 122. The second chip 130 may be electrically connected to the redistribution layer 150 via the conductive bumps 132.

In the present embodiment, the plurality of first conductive bumps on the first chip 120 and the second chip 130 is electrically connected via the redistribution layer 150. The plurality of second conductive bumps on the first chip 120 and the second chip 130 is electrically connected to the circuit substrate 110 via the redistribution layer 150 and the plurality of conductive connectors 160. For example, the plurality of first conductive bumps 1221 on the first chip 120 and the plurality of first conductive bumps 1321 on the second chip 130 may be electrically connected via the redistribution layer 150. The plurality of second conductive bumps 1222 on the first chip 120 and the plurality of second conductive bumps 1322 on the second chip 130 may be electrically connected to the circuit substrate 110 via the redistribution layer 150 and the plurality of conductive connectors 160.

Since the pitch P1 between the plurality of first conductive bumps is less than the pitch P2 between the plurality of second conductive bumps, and the plurality of first conductive bumps on the first chip 120 and the second chip 130 may be electrically connected via the redistribution layer 150, while the plurality of second conductive bumps on the first chip 120 and the second chip 130 may be electrically connected to the circuit substrate 110 via the redistribution layer 150 and the plurality of conductive connectors 160. Therefore, the first conductive bumps and the second conductive bumps having different pitches in the semiconductor package structure 100 of the invention may effectively use the circuit substrate 110 to meet different electrical connection requirements (signal input/output and power supply/grounding) between the two chips. For example, the plurality of first conductive bumps having the fine pitch is electrically connected via the redistribution layer 150 to transmit a signal, while the plurality of second conductive bumps having the coarse pitch is electrically connected to the circuit substrate 110 via the redistribution layer 150 and the plurality of conductive connectors 160 so as to be connected to the power supply/be grounded. In this way, the number of layers required to form the redistribution layer 150 may be reduced, and the manufacturing cost of the semiconductor package structure 100 may further be reduced. Furthermore, through the above configuration manner, the semiconductor package structure 100 may further have better signal integrity/power integrity (SI/PI).

In one embodiment, a line-and-space (L/S) of the redistribution layer 150 may be less than 5 micrometers/5 micrometers. In one embodiment, the line-and-space (L/S) of the redistribution layer 150, for example, is less than 2 micrometers/2 micrometers, so that higher signal transmission capacity can be achieved.

It should be noted that the layout in the drawings is only used for illustration; therefore, in the drawings, some unconnected circuits in the circuit substrate 110 and the redistribution layer 150 may also be electrically connected through via holes or conductive elements in other directions according to the design requirements of the circuits.

Referring to FIG. 1D, a plurality of conductive terminals 170 are formed on the second surface 110b of the circuit substrate 110. The at least one chip (the first chip 120 and the second chip 130) is electrically connected to the plurality of conductive terminals 170 via the redistribution layer 150, the plurality of conductive connectors 160 and the circuit substrate 110, so that the semiconductor package structure 100 may have high I/O connection numbers by virtue of the redistribution layer 150, the plurality of conductive connectors 160 and the circuit substrate 110. Moreover, a signal of the at least one chip (the first chip 120 and the second chip 130) is reconfigured and extended out, so that the electrical capacity and/or efficacy of the semiconductor package structure 100 can be improved.

The conductive terminals 170 may be formed by a ball placement process and/or a reflow process. The conductive terminals 170 may be conductive bumps of a solder ball and the like. However, the invention is not limited thereto. In some alternative embodiments, based on the design requirements, the conductive terminals 170 may have other possible forms and shapes.

The manufacturing of the semiconductor package structure 100 of the present embodiment may be generally completed through the above manufacturing process. The semiconductor package structure 100 includes the circuit substrate 110, the at least one chip (the first chip 120 and the second chip 130), the encapsulant 140, the plurality of conductive connectors 160, the redistribution layer 150 and the plurality of conductive terminals 170. The circuit substrate has the first surface 110a and the second surface 110b opposite to the first surface 110a. The at least one chip (the first chip 120 and the second chip 130) has the active surface and the rear surface opposite to the active surface. The at least one chip (the first chip 120 and the second chip 130) is disposed on the circuit substrate 110 with the rear surface. The encapsulant 140 encapsulates the at least one chip (the first chip 120 and the second chip 130). The plurality of conductive connectors 160 surround the at least one chip (the first chip 120 and the second chip 130). The redistribution layer 150 is located on the encapsulant 140. The plurality of conductive terminals 170 are located on the second surface 110b. The at least one chip (the first chip 120 and the second chip 130) is electrically connected to the plurality of conductive terminals 170 via the redistribution layer 150, the plurality of conductive connectors 160 and the circuit substrate 110.

In the semiconductor package structure 100, since the circuit substrate 110 is not a temporary carrier substrate, the cost for using the temporary carrier substrate can be saved during the manufacturing process of the semiconductor package structure 100, and an additional manufacturing procedure of removing the temporary carrier substrate is avoided, thereby further reducing the manufacturing cost of the semiconductor package structure 100.

Furthermore, the at least one chip (the first chip 120 and the second chip 130) is electrically connected to the plurality of conductive terminals 170 via the redistribution layer 150, the plurality of conductive connectors 160 and the circuit substrate 110, so that the semiconductor package structure 100 may have high I/O connection numbers by virtue of the redistribution layer 150, the plurality of conductive connectors 160 and the circuit substrate 110. Moreover, a signal of the at least one chip (the first chip 120 and the second chip 130) is reconfigured and extended out, so that the electrical capacity and/or efficacy of the semiconductor package structure 100 can further be improved.

It should be noted herein that the reference numerals of components and some contents in the foregoing embodiments also apply in the following embodiments, where the same reference numerals are used to denote the same or similar components, and the descriptions of the same technical contents are omitted. For the description of the omitted part, reference can be made to the foregoing embodiments, and the details are not described in the following embodiments again.

FIG. 2A to FIG. 2E are partial schematic cross-sectional views illustrating partial manufacturing methods of the semiconductor package structure according to another embodiment of the invention. In the present embodiment, a semiconductor package structure 200 is similar to the semiconductor package structure 100. Similar parts are indicated by same reference numerals and have similar functions, materials or forming manners, so that the description is omitted.

Figure 2A:
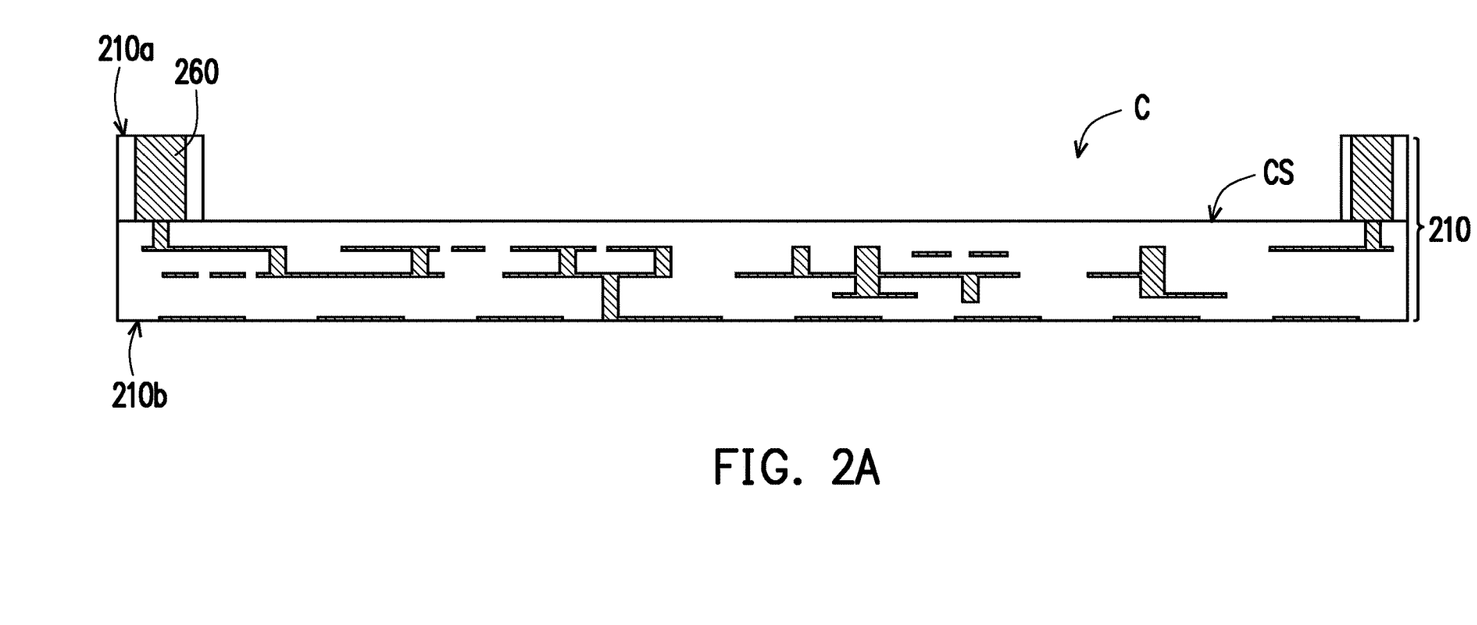
FIG. 2A to FIG. 2E are partial schematic cross-sectional views illustrating partial manufacturing methods of the semiconductor package structure according to another embodiment of the invention.

Referring to FIG. 2A, a circuit substrate 210 is provided. The circuit substrate 210 has a first surface 210a and a second surface 210b opposite to the first surface 210a. In the present embodiment, the circuit substrate 210 is similar to the circuit substrate 110. The difference between the circuit substrate 210 and the circuit substrate 110 lies in that the circuit substrate 210 may include a plurality of preformed conductive connectors 260. In other words, the plurality of conductive connectors 260 may be a part of the circuit substrate 210. The circuit substrate 210 may have a recess C to form a space capable of subsequently configuring chips. In one embodiment, top surfaces of the plurality of conductive connectors 260 may be substantially coplanar with the first surface 210a. A bottom surface CS of the recess C may be located between the first surface 210a and the second surface 210b of the circuit substrate 210.

Figure 2B:
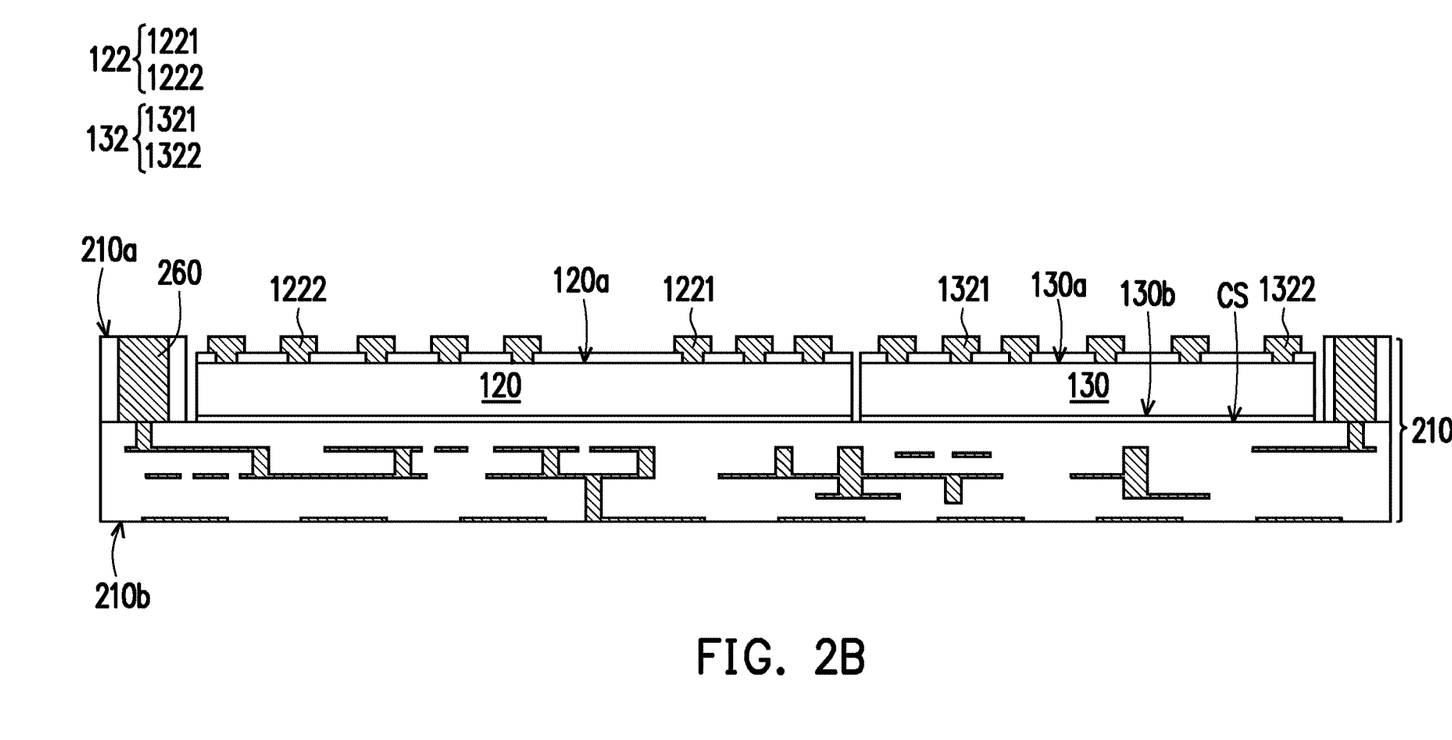

Referring to FIG. 2B, at least one chip is disposed at the recess C of the circuit substrate 110. For example, in the present embodiment, the first chip 120 is disposed at the recess C of the circuit substrate 210 with the rear surface 120b, while the second chip 130 is disposed at the recess C of the circuit substrate 210 with the rear surface 130b. The first chip 120 and the second chip 130 may be attached to the bottom surface CS of the recess C via an adhesive layer, so that the first chip 120 and the second chip 130 are buried in the circuit substrate 110. In one embodiment, a height of the recess C may be greater than a height of each of the at least one chip.

Figure 2C:
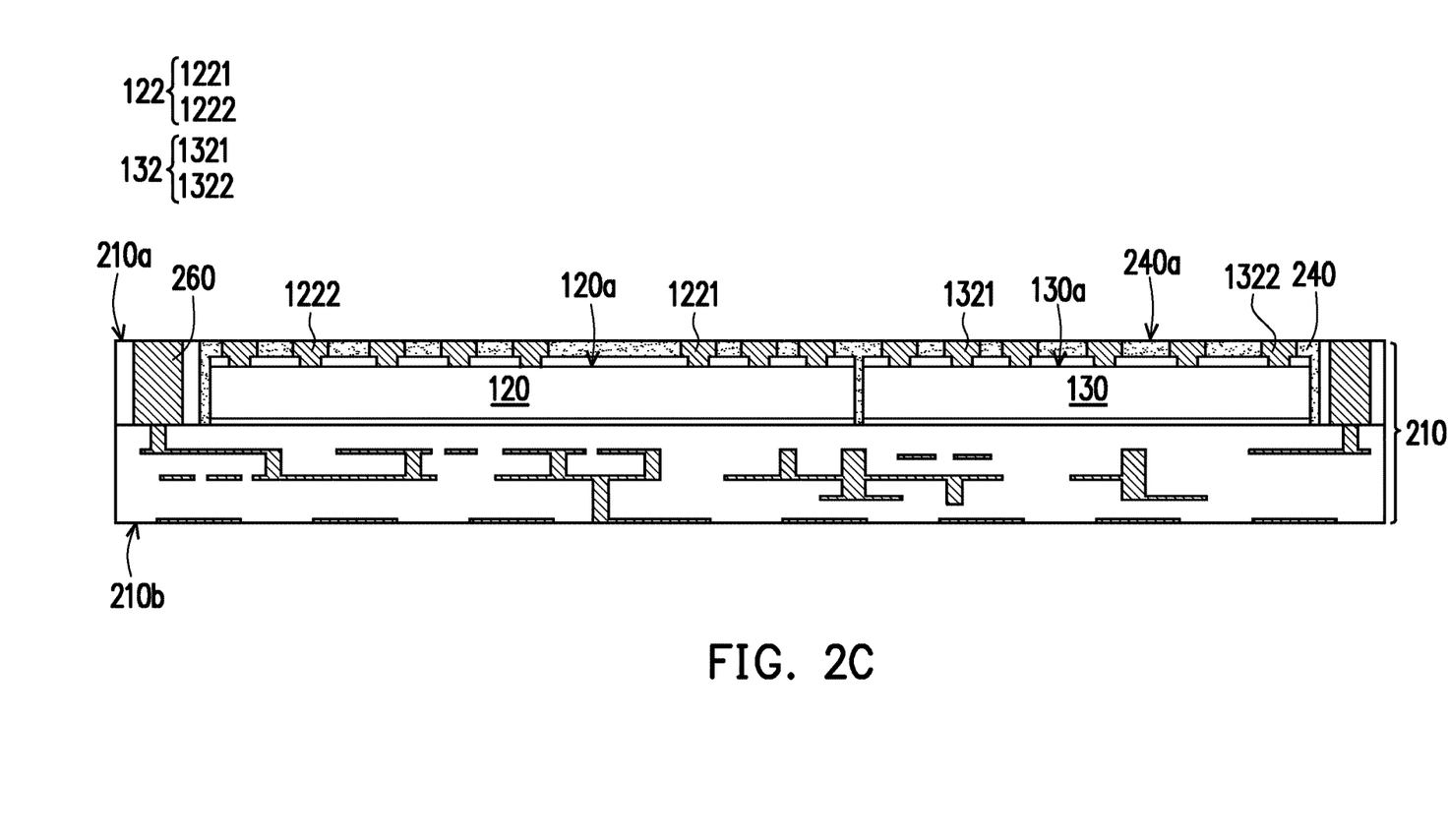

Referring to FIG. 2C, an encapsulant 240 is formed in the recess C to encapsulate the at least one chip (the first chip 120 and the second chip 130). In the present embodiment, the encapsulant 240 is similar to the encapsulant 140. A difference between the encapsulant 240 and the encapsulant 140 lies in that the steps of forming the encapsulant 240 may be as follows: First, an encapsulating material is formed at the recess C and on the first surface 210a of the circuit substrate 210 so as to completely cover the first chip 120, the second chip 130 and the plurality of conductive connectors 260. Subsequently, a planarization process is performed for the encapsulating material until the conductive bumps 122 on the active surface 120a of the first chip 120, the conductive bumps 132 on the active surface 130a of the second chip 130 and the plurality of conductive connectors 260 are exposed, so that top surfaces of the conductive bumps 122 on the active surface 120a of the first chip 120, top surfaces of the conductive bumps 132 on the active surface 130a of the second chip 130, top surfaces of the plurality of conductive connectors 260 and a top surface 240a of the encapsulant 240 are substantially coplanar with the first surface 210a of the circuit substrate 210.

Figure 2D:
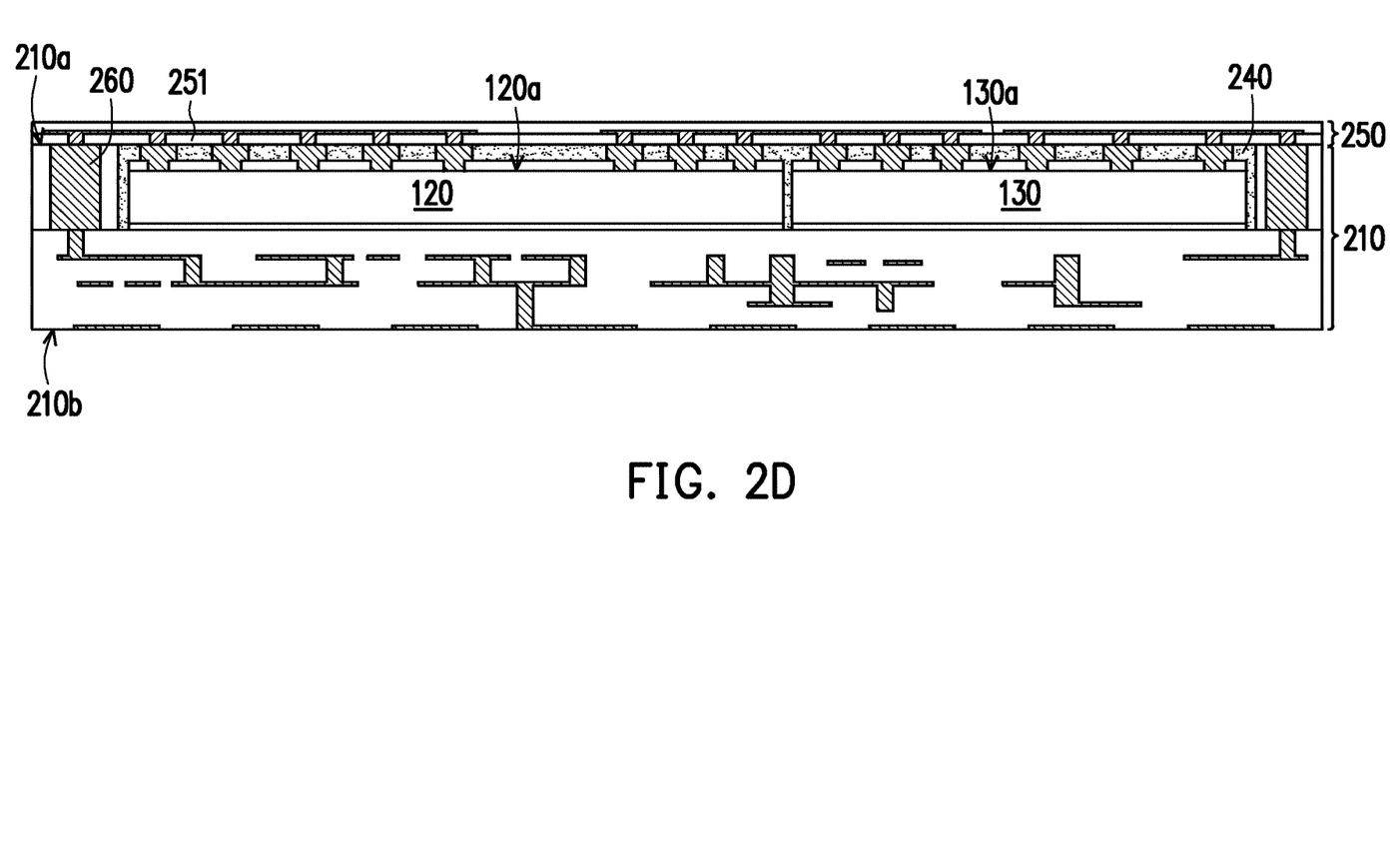

Referring to FIG. 2D, a redistribution layer 250 is formed on the encapsulant 240. The redistribution layer 250 is similar to the redistribution layer 150. A difference between the redistribution layer 250 and the redistribution layer 150 lies in that the plurality of conductive connectors 260 does not extend to the redistribution layer 250, and a part of the circuit substrate 210 may be in direct contact with the redistribution layer 250. The redistribution layer 250 may include bottom dielectric layers 251 close to the encapsulant 240. Patterned conductive layers may include a plurality of conductive patterns 252 close to the encapsulant 240.

In the present embodiment, steps of forming the redistribution layer 250 may be as follows: First, dielectric materials are formed on the encapsulant 240 and the first surface 210a of the circuit substrate 210. Subsequently, a plurality of third openings is formed in the dielectric materials to expose the top surfaces of the plurality of conductive bumps on the active surface of each of the at least one chip (the first chip 120 and the second chip 130) and the top surfaces of the plurality of conductive connectors 260.

Then, conductive materials are formed in the plurality of third openings. The redistribution layer 250 may be in direct contact with the plurality of conductive bumps on the active surface of each of the at least one chip (the first chip 120 and the second chip 130) and the plurality of conductive connectors 260.

Figure 2E:
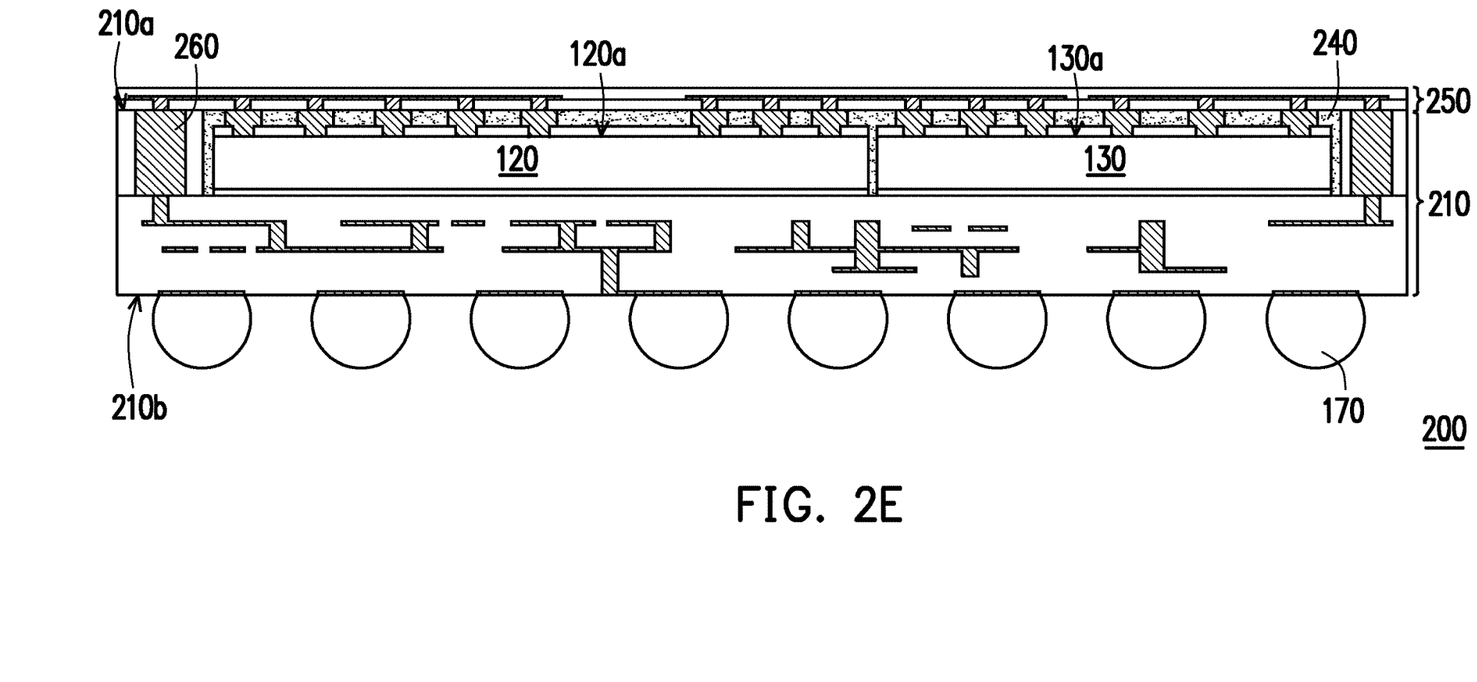

Referring to FIG. 2E, a plurality of conductive terminals 170 is formed on the second surface 210b of the circuit substrate 210. The at least one chip (the first chip 120 and the second chip 130) is electrically connected to the plurality of conductive terminals 170 via the redistribution layer 250, the plurality of conductive connectors 260 and the circuit substrate 210, so that the semiconductor package structure 200 may have high I/O connection numbers by virtue of the redistribution layer 250, the plurality of conductive connectors 260 and the circuit substrate 210. Moreover, a signal of the at least one chip (the first chip 120 and the second chip 130) is reconfigured and extended out, so that the electrical capacity and/or efficacy of the semiconductor package structure 200 can be improved.

The manufacturing of the semiconductor package structure 200 of the present embodiment may be generally completed through the above manufacturing process. The semiconductor package structure 200 includes the circuit substrate 210, the at least one chip (the first chip 120 and the second chip 130), the encapsulant 240, the plurality of conductive connectors 260, the redistribution layer 250 and the plurality of conductive terminals 170. The circuit substrate 210 has the first surface 210a and the second surface 210b opposite to the first surface 210a. The at least one chip (the first chip 120 and the second chip 130) has the active surface and the rear surface opposite to the active surface. The at least one chip (the first chip 120 and the second chip 130) is disposed on the circuit substrate 110 with the rear surface. The encapsulant 240 encapsulates the at least one chip (the first chip 120 and the second chip 130). The plurality of conductive connectors 260 surround the at least one chip (the first chip 120 and the second chip 130). The redistribution layer 250 is located on the encapsulant 240. The plurality of conductive terminals 170 are located on the second surface 110b. The at least one chip (the first chip 120 and the second chip 130) is electrically connected to the plurality of conductive terminals 170 via the redistribution layer 250, the plurality of conductive connectors 260 and the circuit substrate 210.

In the semiconductor package structure 200, since the circuit substrate 210 is not a temporary carrier substrate, the cost for using the temporary carrier substrate can be saved during the manufacturing process of the semiconductor package structure 200, and an additional manufacturing procedure of removing the temporary carrier substrate is avoided, thereby reducing the manufacturing cost of the semiconductor package structure 200.

Furthermore, the at least one chip (the first chip 120 and the second chip 130) is electrically connected to the plurality of conductive terminals 170 via the redistribution layer 250, the plurality of conductive connectors 260 and the circuit substrate 210, so that the semiconductor package structure 200 may have high I/O connection numbers by virtue of the redistribution layer 250, the plurality of conductive connectors 260 and the circuit substrate 210. Moreover, a signal of the at least one chip (the first chip 120 and the second chip 130) is reconfigured and extended out, so that the electrical capacity and/or efficacy of the semiconductor package structure 200 can further be improved.

FIG. 3A to FIG. 3D are partial schematic cross-sectional views illustrating partial manufacturing methods of the semiconductor package structure according to yet another embodiment of the invention. In the present embodiment, the semiconductor package structure 300 is similar to the semiconductor package structure 100. Similar parts are indicated by same reference numerals and have similar functions, materials or forming manners, so that the description is omitted.

Figure 3A:
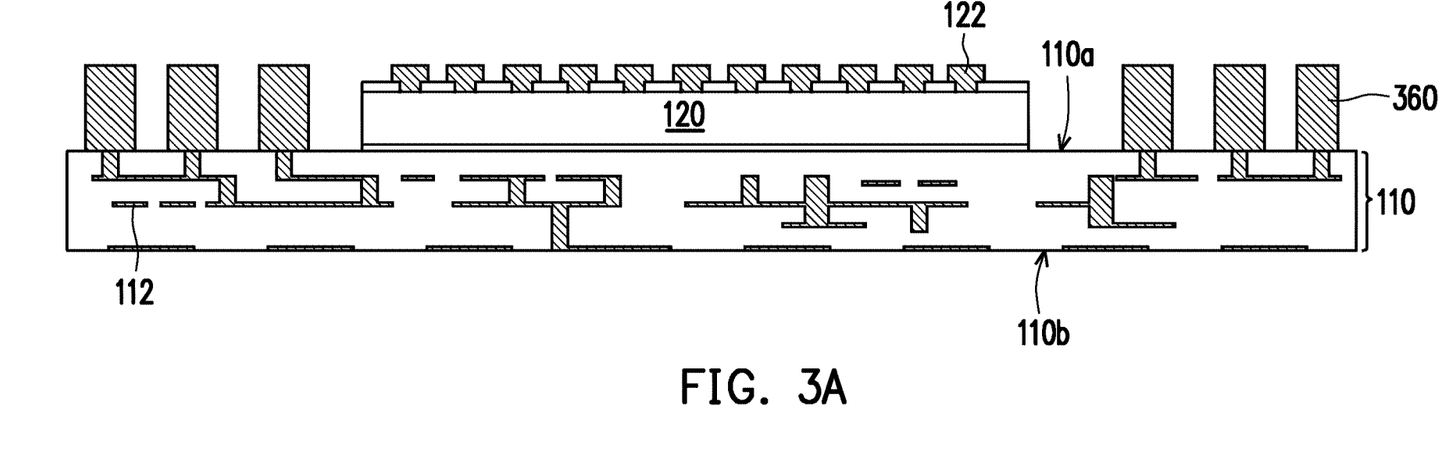
FIG. 3A to FIG. 3D are partial schematic cross-sectional views illustrating partial manufacturing methods of the semiconductor package structure according to yet another embodiment of the invention.

Referring to FIG. 3A, the circuit substrate 110 is provided. The circuit substrate 110 has the first surface 110a and the second surface 110b opposite to the first surface 110a. Thereafter, a plurality of preformed conductive connectors 360 is formed on the first surface 110a. Then at least one chip is disposed on the first surface 110a. One chip (the first chip 120) is schematically shown in FIG. 3A to FIG. 3D, but the invention is not limited thereto.

In the present embodiment, the preformed plurality of conductive connectors 360 may be made of copper, aluminum, nickel, a combination thereof or other suitable conductive materials. The conductive connectors 360 may be formed by electroplating or other suitable manufacturing procedures.

Figure 3B:
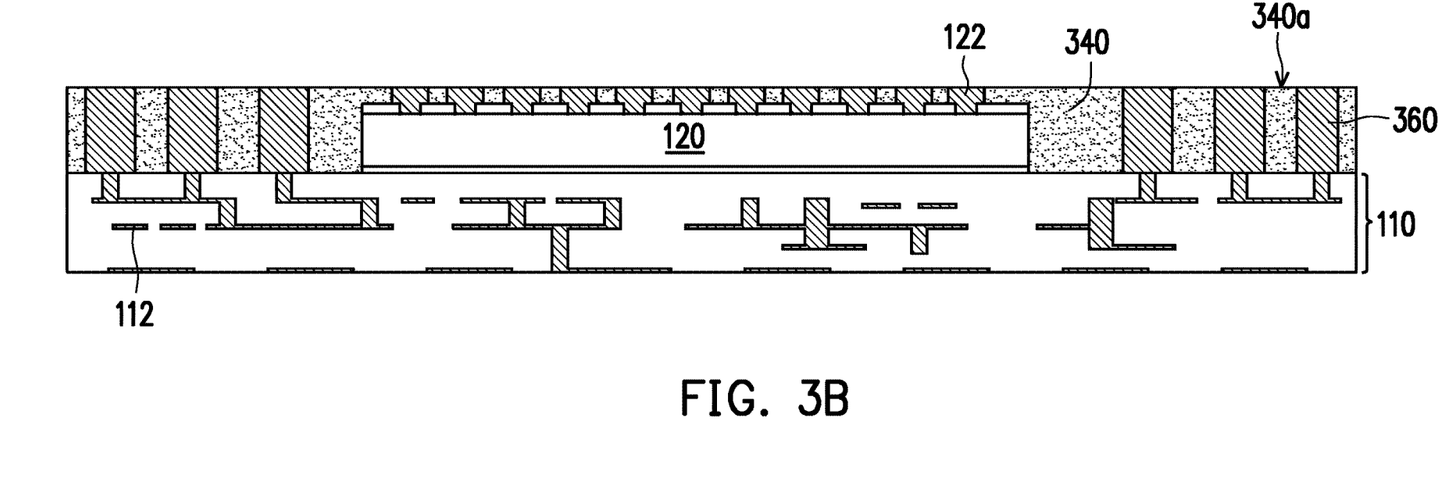

Referring to FIG. 3B, an encapsulant 340 is formed on the first surface 110a of the circuit substrate 110 to encapsulate the at least one chip (the first chip 120). In the present embodiment, the encapsulant 340 is similar to the encapsulant 140. A difference between the encapsulant 340 and the encapsulant 140 lies in that the steps of forming the encapsulant 340 may be as follows: First, an encapsulating material is formed on the first surface 110a of the circuit substrate 110 so as to completely cover the first chip 120 and the plurality of conductive connectors 360. Subsequently, a planarization process is performed for the encapsulating material until top surfaces of the conductive bumps 122 on the active surface 120a of the first chip 120 and top surfaces of the plurality of conductive connectors 360 are exposed, so that the top surfaces of the conductive bumps 122 on the active surface 120a of the first chip 120, the top surfaces of the plurality of conductive connectors 360 and a top surface 340a of the encapsulant 340 are substantially coplanar.

Figure 3C:
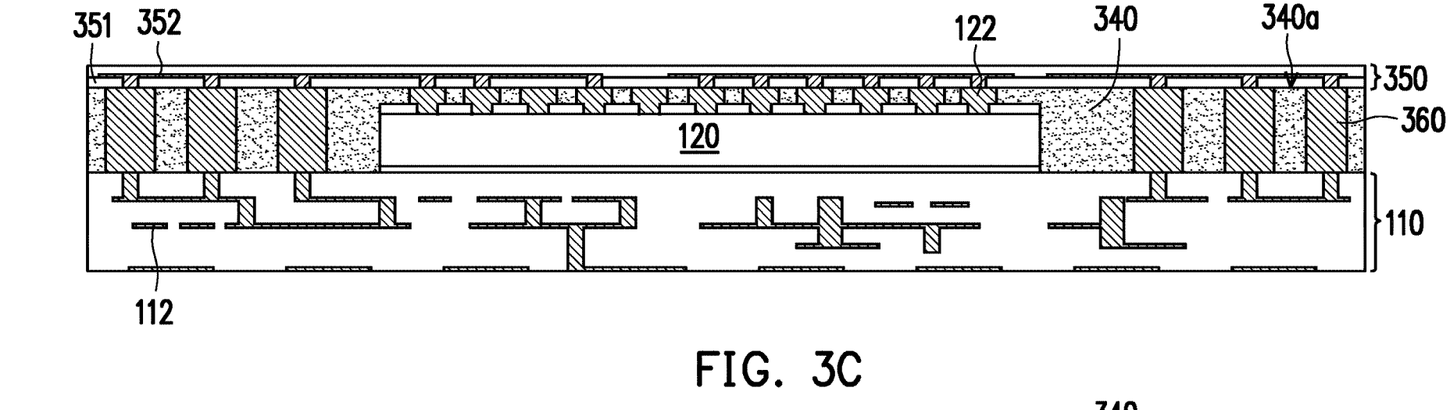

Referring to FIG. 3C, a redistribution layer 350 is formed on the encapsulant 340. The redistribution layer 350 is similar to the redistribution layer 150. A difference between the redistribution layer 350 and the redistribution layer 150 lies in that the plurality of conductive connectors 360 does not extend to the redistribution layer 350. The redistribution layer 350 may include bottom dielectric layers 351 close to the encapsulant 340, while the patterned conductive layers may include a plurality of conductive patterns 352 close to the encapsulant 340.

Figure 3D:
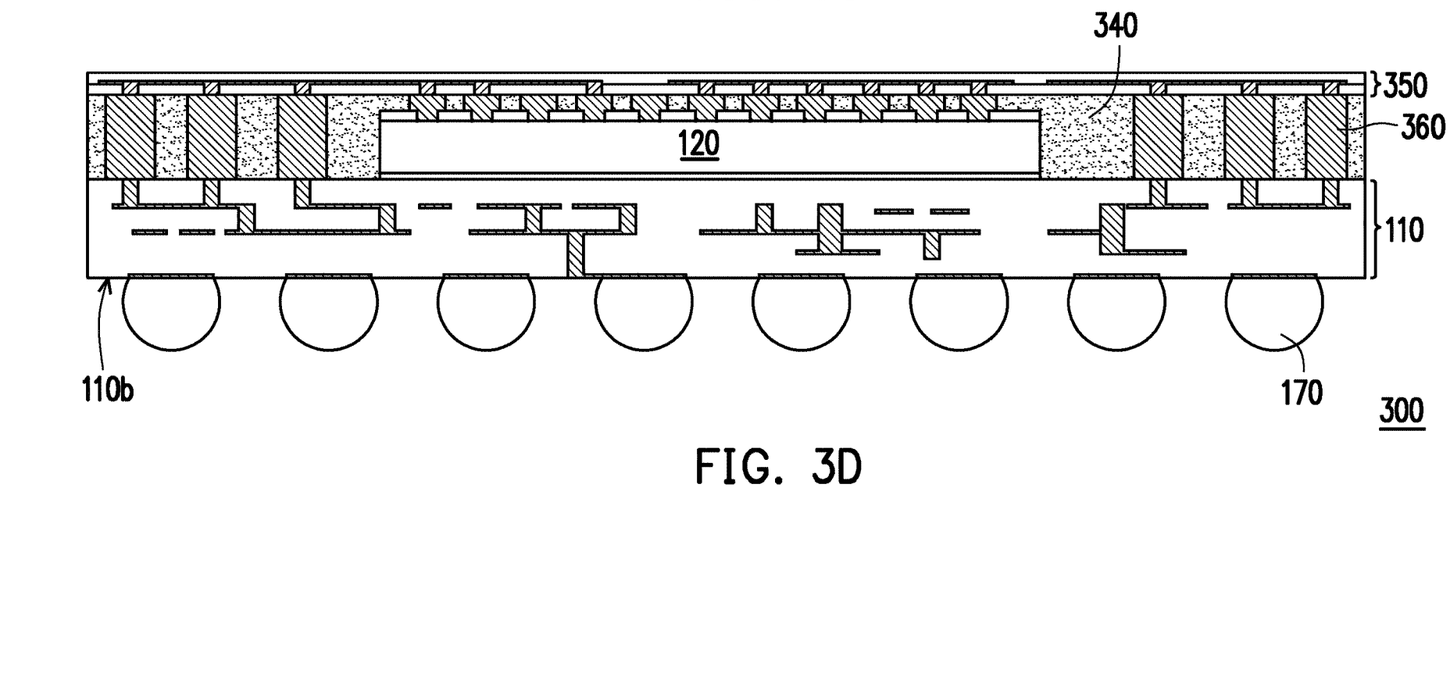

Referring to FIG. 3D, a plurality of conductive terminals 170 is formed on the second surface 110b of the circuit substrate 110. The at least one chip is electrically connected to the plurality of conductive terminals 170 via the redistribution layer 350, the plurality of conductive connectors 360 and the circuit substrate 110, so that the semiconductor package structure 300 may have high I/O connection numbers by virtue of the redistribution layer 350, the plurality of conductive connectors 360 and the circuit substrate 110. Moreover, a signal of the at least one chip (the first chip 120) is reconfigured and extended out, so that the electrical capacity and/or efficacy of the semiconductor package structure 300 can further be improved.

The manufacturing of the semiconductor package structure 300 of the present embodiment may be generally completed through the above manufacturing process. The semiconductor package structure 300 includes the circuit substrate 110, the at least one chip (the first chip 120), the encapsulant 340, the plurality of conductive connectors 360, the redistribution layer 350 and the plurality of conductive terminals 170. The circuit substrate 110 has the first surface 110a and the second surface 110b opposite to the first surface 110a. The at least one chip (the first chip 120) has the active surface and the rear surface opposite to the active surface. The at least one chip (the first chip 120) is disposed on the circuit substrate 110 with the rear surface. The encapsulant 340 encapsulates the at least one chip (the first chip 120). The plurality of conductive connectors 360 surround the at least one chip (the first chip 120). The redistribution layer 350 is located on the encapsulant 340. The plurality of conductive terminals 170 are located on the second surface 110b. The at least one chip (the first chip 120) is electrically connected to the plurality of conductive terminals 170 via the redistribution layer 350, the plurality of conductive connectors 360 and the circuit substrate 110.

In the semiconductor package structure 300, since the circuit substrate 110 is not a temporary carrier substrate, the cost for using the temporary carrier substrate can be saved during the manufacturing process of the semiconductor package structure 300, and an additional manufacturing procedure of removing the temporary carrier substrate is avoided, thereby reducing the manufacturing cost of the semiconductor package structure 300.

Furthermore, the at least one chip (the first chip 120) is electrically connected to the plurality of conductive terminals 170 via the redistribution layer 350, the plurality of conductive connectors 360 and the circuit substrate 110, so that the semiconductor package structure 300 may have high I/O connection numbers by virtue of the redistribution layer 350, the plurality of conductive connectors 360 and the circuit substrate 110. Moreover, a signal of the at least one chip (the first chip 120) is reconfigured and extended out, so that the electrical capacity and/or efficacy of the semiconductor package structure 300 can further be improved.

Based on the foregoing, in the semiconductor package structure, since the circuit substrate is not a temporary carrier substrate, the cost for using the temporary carrier substrate can be saved during the manufacturing process of the semiconductor package structure, and an additional manufacturing procedure of removing the temporary carrier substrate is avoided, thereby reducing the manufacturing cost of the semiconductor package structure. Moreover, since the at least one chip is electrically connected to the plurality of conductive terminals via the redistribution layer, the plurality of conductive connectors and the circuit substrate, the semiconductor package structure has high I/O connection numbers by virtue of the redistribution layer, the plurality of conductive connectors and the circuit substrate. Moreover, a signal of the at least one chip is reconfigured and extended out, so that the electrical performance and/or efficacy of the semiconductor package structured can be improved. Furthermore, when the number of the at least one chip is two or more, the first conductive bumps and the second conductive bumps having different pitches can effectively use the circuit substrate to meet different electrical connection requirements (signal input/output and power supply/grounding) between the two chips, so that the semiconductor package structure may further have better signal integrity/power integrity.

What is claimed is:

1. A semiconductor package structure, comprising:
    a circuit substrate having a first surface and a second surface opposite to the first surface;
    at least one chip having an active surface and a rear surface opposite to the active surface, wherein the at least one chip is disposed on the circuit substrate with the rear surface;
    an encapsulant, to encapsulate the at least one chip;
    a plurality of conductive connectors surrounding the at least one chip;
    a redistribution layer located on the encapsulant; and
    a plurality of conductive terminals located on the second surface, wherein the at least one chip is electrically connected to the plurality of conductive terminals via the redistribution layer, the plurality of conductive connectors and the circuit substrate,
    wherein the active surface of each of the at least one chip comprises a plurality of conductive bumps, and the at least one chip is electrically connected to the redistribution layer via the plurality of conductive bumps, the plurality of conductive bumps comprises a plurality of first conductive bumps and a plurality of second conductive bumps, a pitch between the plurality of first conductive bumps is less than a pitch between the plurality of second conductive bumps, the plurality of first conductive bumps are used as a signal input/output contact, and the plurality of second conductive bumps are used as a power supply/grounding contact.

2. The semiconductor package structure according to claim 1, wherein the at least one chip comprises a first chip and a second chip, and the plurality of first conductive bumps on the first chip and the second chip is electrically connected via the redistribution layer.

3. The semiconductor package structure according to claim 1, wherein the plurality of second conductive bumps on the first chip and the second chip is electrically connected to the circuit substrate via the redistribution layer and the plurality of conductive connectors.

4. The semiconductor package structure according to claim 1, wherein the encapsulant fills between the plurality of conductive connectors.

5. The semiconductor package structure according to claim 1, wherein the plurality of conductive connectors penetrate through the encapsulant.

6. The semiconductor package structure according to claim 1, wherein top surfaces of the plurality of conductive connectors are substantially coplanar with a top surface of the encapsulant.

7. The semiconductor package structure according to claim 1, wherein the plurality of conductive connectors extends from the redistribution layer to the circuit substrate.

8. The semiconductor package structure according to claim 1, wherein the plurality of conductive connectors is buried in the circuit substrate.

9. The semiconductor package structure according to claim 8, wherein a part of the circuit substrate is in direct contact with the redistribution layer.

10. A manufacturing method of a semiconductor package structure, comprising:
    providing a circuit substrate having a first surface and a second surface opposite to the first surface;
    disposing at least one chip on the first surface, wherein the at least one chip having an active surface and a rear surface opposite to the active surface, and the at least one chip is disposed on the circuit substrate with the rear surface;
    forming an encapsulant, to encapsulate the at least one chip;
    forming a plurality of conductive connectors surrounding the at least one chip;
    forming a redistribution layer on the encapsulant; and
    forming a plurality of conductive terminals on the second surface, wherein the at least one chip is electrically connected to the plurality of conductive terminals via the redistribution layer, the plurality of conductive connectors and the circuit substrate;
    wherein the active surface of each of the at least one chip comprises a plurality of conductive bumps, and the at least one chip is electrically connected to the redistribution layer via the plurality of conductive bumps, the plurality of conductive bumps comprises a plurality of first conductive bumps and a plurality of second conductive bumps, a pitch between the plurality of first conductive bumps is less than a pitch between the plurality of second conductive bumps, the plurality of first conductive bumps are used as a signal input/output contact, and the plurality of second conductive bumps are used as a power supply/grounding contact.

11. The manufacturing method of the semiconductor package structure according to claim 10, wherein the plurality of conductive connectors are formed after the encapsulant is formed.

12. The manufacturing method of the semiconductor package structure according to claim 11, wherein steps of forming the redistribution layer comprise:
   forming a dielectric material on the encapsulant;
   forming a plurality of first openings to expose at least a part of the plurality of conductive bumps on the active surface of each of the at least one chip;
   forming a plurality of second openings to expose a part of the first surface of the circuit substrate; and
   forming conductive materials in the plurality of first openings, the conductive materials at least covering side walls and bottom surfaces of the plurality of second openings.

13. The manufacturing method of the semiconductor package structure according to claim 10, wherein the plurality of conductive connectors are formed before the encapsulant is formed.

14. The manufacturing method of the semiconductor package structure according to claim 13, wherein steps of forming the redistribution layer comprises:
   forming a plurality of third openings to expose the top surfaces of at least the part of the plurality of conductive bumps on the active surface of each of the at least one chip and a top surfaces of the plurality of conductive connectors; and
   forming the conductive materials in the plurality of third openings.

15. The manufacturing method of the semiconductor package structure according to claim 10, wherein the plurality of conductive connectors is preformed conductive connectors.

16. The manufacturing method of the semiconductor package structure according to claim 15, wherein the preformed conductive connectors are buried in the circuit substrate.

17. The manufacturing method of the semiconductor package structure according to claim 16, wherein the circuit substrate comprises a recess, and the at least one chip is disposed in the recess.

18. The manufacturing method of the semiconductor package structure according to claim 17, wherein a height of the recess is greater than a height of each of the at least one chip.

* * * * *